US011937379B2

(12) United States Patent
Klocek

(10) Patent No.: US 11,937,379 B2
(45) Date of Patent: Mar. 19, 2024

(54) ANISOTROPIC ETCHING USING PHOTOSENSITIVE COMPOUND

(71) Applicant: AT&S Austria Technologie & Systemtechnik Aktiengesellschaft, Leoben (AT)

(72) Inventor: Jolanta Klocek, Niklasdorf (AT)

(73) Assignee: AT&S Austria Technologie &Systemtechnik AG, Leoben (AT)

( * ) Notice: Subject to any disclaimer, the term of this patent is extended or adjusted under 35 U.S.C. 154(b) by 0 days.

(21) Appl. No.: 17/301,130

(22) Filed: Mar. 25, 2021

(65) Prior Publication Data
US 2021/0315104 A1 Oct. 7, 2021

(30) Foreign Application Priority Data

Mar. 30, 2020 (EP) ..................... 20166592

(51) Int. Cl.
*H05K 3/06* (2006.01)
(52) U.S. Cl.
CPC ............. *H05K 3/067* (2013.01); *H05K 3/062* (2013.01); *H05K 3/068* (2013.01)
(58) Field of Classification Search
CPC ........ H05K 3/067; H05K 3/062; H05K 3/068; H05K 2203/0789; H05K 2203/107; H05K 2203/1105; H05K 2203/1194; H05K 2203/122; H05K 2203/124; H05K 3/06; H05K 13/00

(Continued)

(56) References Cited

U.S. PATENT DOCUMENTS 3,567,290 A * 3/1971 Yukiya .................... B60T 8/425
303/122.1
5,279,702 A * 1/1994 Douglas ............ H01L 21/32134
257/E21.309

(Continued)

FOREIGN PATENT DOCUMENTS

CN 109023370 A * 12/2018 ................ C23F 1/18
EP 3518630 A1 7/2019

(Continued)

OTHER PUBLICATIONS

May, B. et al: Reactions of a Polyhalide Ionic Liquid with Copper, Silver, and Gold, Chemistry Open, vol. 8, No. 1, Oct. 31, 2018, pp. 15-22, XP055734063, ISSN 2191 1363, DOI: 10.1002/open.201800149.

(Continued)

*Primary Examiner* — Duy Vu N Deo
(74) *Attorney, Agent, or Firm* — Robert A. Blaha; Smith Tempel Blaha LLC

(57) ABSTRACT

A method of etching an electrically conductive layer structure during manufacturing a component carrier is provided. The method includes subjecting the electrically conductive layer structure to an etching composition having an etchant and a photosensitive compound to thereby form a recess in the electrically conductive layer structure; while, at least for a part of time, irradiating and/or heating the recess. In addition, an apparatus for etching an electrically conductive layer structure during manufacturing a component carrier, an etched electrically conductive layer structure and a component carrier are provided.

10 Claims, 2 Drawing Sheets

(58) Field of Classification Search
USPC .................................................. 438/745, 754
See application file for complete search history.

(56) References Cited

U.S. PATENT DOCUMENTS

| | | | | |
|---|---|---|---|---|
| 5,460,687 | A | * 10/1995 | Douglas | ............ H01L 21/30655 |
| | | | | 257/E21.309 |
| 6,423,207 | B1 | 7/2002 | Babak et al. | |
| 10,907,258 | B1 | * 2/2021 | Kota | .................... C23F 1/20 |
| 2008/0245674 | A1 | 10/2008 | Von Gutfeld | |

FOREIGN PATENT DOCUMENTS

| | | | | |
|---|---|---|---|---|
| JP | 2009235438 | A | * 10/2009 | ................ C23F 1/18 |
| JP | 2010209406 | A | * 9/2010 | |
| WO | WO-2011119707 | A2 | * 9/2011 | ............. B82Y 10/00 |

OTHER PUBLICATIONS

Dardel, B.; Extended European Search Report in Application No. 20166592.4; pp. 1-10; dated Oct. 6, 2020; European Patent Office; 80298, Munich, Germany.

Norikane, Y. et al.; Photoinduced Crystal-to-Liquid Phase Transitions of Azobenzene Derivatives and Their Application in Photolithography Processes Through a Solid-Liquid Patterning; Organization Letters, Oct. 3, 2014, vol. 16, No. 19, pp. 5012-5015; American Chemical Society; XP093002082, US ISSN: 1523-7060, DOI:10.1021/ol502223u.

Dardel, B.; Office Action in Application No. 20166592.4; pp. 1-10; dated Dec. 1, 2022; European Patent Office, Postbus 5818, 2280, HV Rijswijk, Netherlands.

Dardel, B.; Result of Consultation in Application No. 20166592.4; pp. 1-3; Nov. 28, 2022; European Patent Office, Postbus 5818, 2280, HV Rijswijk, Netherlands.

Dai, H. et al.; Highly sensitive determination of 4-nitrophenol with coumarin-based fluorescent molecularly imprinted poly (ionic liquid); Jopurnal of Hazardous Materials 398 (2020) 122854; pp. 1-9; available online on May 19, 2020; Elsevier B.V .; https://doi.org/10/1016/j.jhazmat.2020.122854.

Tamura, H.; Synthesis of Photochemistry of Stilbene Ionic Liquids; Chem. Lett. 2010, vol. 39, pp. 240-241; The Chemical Society of Japan; available online Feb. 6, 2010; doi: 10.1246/cl.2010.240.

* cited by examiner

ANISOTROPIC ETCHING USING PHOTOSENSITIVE COMPOUND

CROSS-REFERENCE TO RELATED APPLICATION

The present application claims the benefit of the filing date of the European Patent Application No. 20 166 592.4, filed Mar. 30, 2020, the disclosure of which is hereby incorporated herein by reference.

TECHNICAL FIELD

Embodiments of the invention relate to a method of etching an electrically conductive layer structure (hereinafter, also simply referred to as an "etching process"), an apparatus for etching an electrically conductive layer structure during manufacturing a component carrier (hereinafter, also simply referred to as an "etching apparatus"), an etched electrically conductive layer structure and a component carrier.

TECHNOLOGICAL BACKGROUND

In the context of growing product functionalities of component carriers equipped with one or more components and increasing miniaturization of such components as well as a rising number of components to be mounted on component carriers such as printed circuit boards (PCBs), increasingly more powerful array-like components or packages having several components are being employed, which have a plurality of contacts or connections, with ever smaller spacing between these contacts.

The PCB industry is in particular confronted with the task to adapt the size of the produced printed circuit boards to comply with the miniaturization requirements. Due to the new dimensions of the circuit paths, drill holes and their distance from each other, it is necessary to implement new etching techniques, in particular new copper etching processes. Although the copper etching process is one of the most important steps in the manufacture of printed circuit boards, processing of copper during fabrication is still a challenging task. In a conventional isotropic copper etching process as shown in FIG. 1, when a copper film to be etched formed on a substrate and partly covered by a mask (as a negative template for patterning) is etched, undercuts may be formed beneath the mask due to isotropic etching, resulting in poor adhesion. In addition, isotropic etching may not be capable of forming very fine etching structures, but isotropic etching may be blocked by respective, fine masks structures.

The generation of fine structures with circuit paths of 30 microns and below may require an anisotropic etching process. In case of printed circuit boards, it is desired that the etching (in particular the copper removal) occurs more in the vertical direction rather than in the lateral direction. Hereby, regular structures may be obtained and short cuts may be avoided. An ideal anisotropic etching process is shown in FIG. 2, wherein the etching exclusively occurs in the vertical direction, but not in the lateral direction of the PCB so that no undercuts are formed.

SUMMARY

There may be a need to provide an etching process allowing an anisotropic etching of an electrically conductive layer structure during manufacturing a component carrier and to obtain an etched electrically conductive layer structure having a recess with at least partly (preferably completely, i.e. along the entire depth) substantially vertical side walls as well as a respective component carrier comprising the same, thereby increasing the overall quality of the component carrier, such as a printed circuit board.

A method of etching an electrically conductive layer structure during manufacturing a component carrier, an apparatus for etching an electrically conductive layer structure during manufacturing a component carrier, an etched electrically conductive layer structure and a component carrier according to the independent claims are provided.

According to an exemplary embodiment of the invention, a method of etching an electrically conductive layer structure during manufacturing a component carrier comprises subjecting (an exposed region of) the electrically conductive layer structure to an etching composition comprising an etchant and a photosensitive compound to thereby form a recess (cavity) in the electrically conductive layer structure, while, at least for a part of time, (substantially vertically) irradiating and/or heating (the electrically conductive layer structure and/or) the recess, in particular or preferentially the bottom (or a bottom portion) of the recess.

According to another exemplary embodiment of the invention, an apparatus for etching an electrically conductive layer structure during manufacturing a component carrier comprises an etching unit configured for subjecting the electrically conductive layer structure to an etching composition comprising an etchant and a photosensitive compound to thereby form a recess (cavity) in the electrically conductive layer structure, and an irradiation unit configured for (substantially vertically) irradiating the recess, in particular or preferentially a bottom portion of the recess and/or a heating unit configured for (substantially vertically) heating the recess, in particular or preferentially a bottom portion of the recess.

According to still another exemplary embodiment of the invention, an etched electrically conductive layer structure is provided that is obtainable (or can be produced) by an etching process as described herein.

Overview of Embodiments

According to yet another exemplary embodiment of the invention, a component carrier is provided, wherein the component carrier comprises a stack of at least one electrically insulating layer structure and at least one electrically conductive layer structure, wherein at least a part of at least one electrically conductive layer structure comprises an etched electrically conductive layer structure as described herein.

According to an exemplary embodiment of the invention, an etching process is provided involving the use of an etching composition comprising an etchant (which may etch an electrically conductive layer structure made for instance of copper and thereby form a recess therein) and a photosensitive compound (which may be responsive to irradiation (such as electromagnetic radiation) and/or thermal energy (such as heat)) in a manner such that the etching proceeds more in a vertical direction than in a lateral direction of the recess, thereby increasing an anisotropy of the etching process). For instance, the photosensitive compound may have a high affinity to copper (such as due to respective functional groups of the photosensitive compound) and may consequently tend to adhere to a copper surface, thereby impeding a contact of an etchant with the copper surface and consequently inhibiting an etching of the copper surface by the etchant. Furthermore, the photosensitive compound may be responsive to irradiation and/or heating in a manner that the affinity to copper of the photosensitive compound may be reduced by means of irradiating and/or heating the photosensitive compound. As a result, such irradiated and/or heated photosensitive compound may no longer tend to adhere to a copper surface, but rather detach therefrom and therefore may no longer protect or shield the copper surface from the etchant. By directing the irradiation and/or heating specifically or preferentially at a bottom part of the recess rather than at a side-wall part of the recess (for instance by irradiating and/or heating the recess substantially vertically), the detachment or deprotection may specifically occur at the bottom part and consequently the etching may preferentially proceed in the vertical direction rather than in the lateral direction of the recess. As a result, an etched electrically conductive layer structure having a recess with substantially vertical side walls may be obtained. As another example, the photosensitive compound may be responsive to irradiation and/or heating in a manner that ions may be generated and/or the electrical conductivity and/or the etching velocity may be increased by irradiating and/or heating the photosensitive compound. As a result, the reactivity of an etching composition containing the photosensitive compound may be increased due to irradiation and/or heating. Also in this case, by directing the irradiation and/or heating specifically or preferentially at a bottom part of the recess rather than at a side-wall part of the recess, the etching may preferentially proceed in the vertical direction rather than in the lateral direction of the recess and, as a result, an etched electrically conductive layer structure having a recess with substantially vertical side walls may be obtained. As still another example, the photosensitive compound may have a low affinity to copper and may be responsive to irradiation and/or heating in a manner that the affinity to copper of the photosensitive compound may be increased by means of irradiating and/or heating the photosensitive compound. For instance, in photo-reactions based on isomerization (such as, in case of azo compounds), the polarity of the excited molecules may increase, which may result in an increased affinity towards copper.

In the following, further exemplary embodiments of the method of etching an electrically conductive layer structure, the apparatus for etching an electrically conductive layer structure during manufacturing a component carrier, the etched electrically conductive layer structure and the component carrier will be explained. However, the present invention is not limited to the following specific descriptions of exemplary embodiments, but they are rather for illustrative purposes only.

It should be noted that features described in connection with one exemplary embodiment or exemplary aspect may be combined with any other exemplary embodiment or exemplary aspect, in particular features described with any exemplary embodiment of an etching process may be combined with any other exemplary embodiment of an etching process and any exemplary embodiment of an etching apparatus, an etched electrically conductive layer structure, a component carrier and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

It should be noted that the term "comprising" does not exclude other elements or steps and, as used herein, includes not only the meaning of "comprising", "including" or "containing", but may also encompass "consisting essentially of" and "consisting of".

Unless specifically stated otherwise, the expressions "at least partially", "at least partly", "at least part of" or "at least a part of", as used herein, may mean at least 1% thereof, in particular at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also include 100% thereof.

In an embodiment, the method of etching an electrically conductive layer structure during manufacturing a component carrier may further comprise (in particular prior to subjecting the electrically conductive layer structure to an etching composition) a step of patterning a mask layer or photoresist layer (in particular a dry film photoresist) on the electrically conductive layer structure to thereby expose at least one region of the electrically conductive layer structure. By taking this measure, particular regions of the electrically conductive layer structure, which regions are to be etched, may be defined in an efficient manner. For example, the step of patterning a mask layer may involve a photolithographic structuring of an electrically conductive layer structure of a component carrier by means of a photoresist, which may include applying a photoresist layer on the electrically conductive layer structure, partly exposing the photoresist through a mask to electromagnetic radiation (such as UV light), followed by developing, thereby removing that part of the photoresist that has been exposed to the electromagnetic radiation or, alternatively, removing that part of the photoresist that has not been exposed to the electromagnetic radiation.

In an embodiment, the method of etching an electrically conductive layer structure during manufacturing a component carrier comprises a step of subjecting (an exposed region of) the electrically conductive layer structure to an etching composition comprising an etchant and a photosensitive compound to thereby form a recess (cavity) in the electrically conductive layer structure. While subjecting the electrically conductive layer structure to the etching composition, at least for a part of time, the electrically conductive layer structure and/or the recess, in particular a bottom portion or the bottom of the recess, is irradiated and/or heated. It may be advantageous to perform the irradiation and/or heating in a substantially vertical manner so as to specifically or preferentially irradiate and/or heat the bottom portion or the bottom of the recess.

In the context of the present application, the term "etching composition" may particularly denote a fluid, such as a solution or a liquid, which is capable of at least partly etching (dissolving) an electrically conductive material, such as a metal, in particular—but not limited to—copper, aluminum, nickel or silver. To this end, the etching composition comprises an etchant (etching agent) representing a reactive component of the composition substantially responsible for the at least partly etching (dissolving) an electrically conductive material. The etching compositions may be prepared by dissolving the various ingredients, as exemplified in further detail in the following, in an appropriate solvent, such as water and/or an organic solvent, or without a solvent, for instance in an ionic liquid.

In an embodiment, the etchant comprises at least one of cupric chloride ($CuCl_2$) and ferric chloride ($FeCl_3$) and may optionally further comprise at least one of hydrochloric acid (HCl) and hydrogen peroxide ($H_2O_2$). Alternatively, an alkaline etchant may be employed, for instance based on ammonia ($NH_3$) and ammonium chloride ($NH_4Cl$). It might be advantageous that the etchant comprises cupric chloride ($CuCl_2$), which may be combined with hydrochloric acid (HCl) and/or hydrogen peroxide ($H_2O_2$), in particular when the etching composition is intended for etching an electrically conductive layer structure of a component carrier.

In addition to an etchant, the etching composition comprises a photosensitive compound, in particular one or more (such as at least two or at least three) photosensitive compounds. In the context of the present application, the term "photosensitive compound" may particularly denote a compound that is responsive to irradiation with in particular electromagnetic radiation and/or thermal energy (such as heat). Thus, the term "photosensitive" may particularly denote a characteristic of being responsive to irradiation with in particular electromagnetic radiation or photons and/or to heating. In other words, it may be possible to trigger a response of a photosensitive compound by irradiating and/or heating the photosensitive compound, in particular by means of electromagnetic radiation or photons and/or by means of heat. More specifically, a photosensitive compound within the meaning of the present invention may be responsive to irradiation and/or heating in a manner such that an etching proceeds more in a vertical direction than in a lateral direction of an electrically conductive layer structure, i.e. such that the etching becomes anisotropic or an anisotropy of the etching is increased. For instance, it may be possible to trigger or evoke a reduced (or alternatively increased) affinity to copper of the photosensitive compound by irradiating and/or heating the photosensitive compound so that the photosensitive compound may detach from (or alternatively attach to) a copper surface upon (due to, as a result of) the irradiation and/or heating. Alternatively or additionally, it may be possible to trigger or evoke the generation of ions (allowing to etch the processed metal) and/or an increase in electrical conductivity and/or in etching velocity by irradiating and/or heating the photosensitive compound so that the reactivity of an etching composition containing the photosensitive compound may be increased upon (due to, as a result of) to irradiation and/or heating.

In an embodiment, the photosensitive compound has at least one functional group configured for inhibiting copper etching (hereinafter, also simply referred to as a "copper etching inhibiting functional group"). For instance, the copper etching inhibiting functional group may exhibit a high affinity to copper so that the photosensitive compound may tend to adhere to a copper surface, thereby impeding a contact of an etchant with the copper surface and consequently inhibiting an etching of the copper surface by the etchant.

In an embodiment, the at least one functional group configured for inhibiting copper etching is selected from the group consisting of a phosphor atom containing group, a nitrogen atom containing group, a sulphur atom containing group and a conjugated n-system. In the context of the present application, the term "conjugated n-system" may particularly denote a system of connected p-orbitals with delocalized electrons in compounds with alternating single and multiple bonds, which in general may lower the overall energy of the molecule and increase stability, such as an aromatic ring system. A phosphor atom containing group, a nitrogen atom containing group, a sulphur atom containing group have shown to preferably adsorb onto metallic surfaces. Moreover, compounds showing a conjugated n-system, such as phenolic compounds, have shown good adhesion properties.

In an embodiment, the at least one functional group configured for inhibiting copper etching is selected from the group consisting of an azole, a triazo phosphonate, a p-nitro aryl (such as a p-nitro phenyl) and a secondary amine. Suitable examples of an azole include a thiadiazole (such as a 1,3,4-thiadiazole), a triazole (such as a 1,2,4-triazole) or a benzotriazole.

In an embodiment, the photosensitive compound is configured for detaching from (or alternatively attaching to) a copper surface upon (due to, as a result of) the irradiation and/or heating. To this end, the photosensitive compound may have at least one functional group, as will be exemplified in further detail below and which is also simply referred to as a "photosensitive functional group" hereinafter. Thus, the photosensitive compound may be responsive to irradiation and/or heating in a manner that the affinity to copper of the photosensitive compound may be reduced (or alternatively increased) by means of irradiating and/or heating the photosensitive compound. As a result, such irradiated and/or heated photosensitive compound may no longer tend to adhere to a copper surface, but rather detach therefrom and therefore may no longer protect or shield the copper surface from the etchant or vice versa. By directing irradiation and/or heating specifically or preferentially at a bottom part of the recess rather than at a side-wall part of the recess (for instance by irradiating and/or heating the recess substantially vertically), the detachment or deprotection may specifically occur at the bottom part and consequently the etching may preferentially proceed in the vertical direction rather than in the lateral direction of the recess. As a result, an etched electrically conductive layer structure having a recess with substantially vertical side walls may be obtained.

In an embodiment, it may be advantageous if the photosensitive compound is configured for reversibly detaching from a copper surface due to irradiation and/or heating. Thus, it might be preferable if the photosensitive compound may attach again to the copper surface if no longer irradiated and/or heated (or vice versa). Hereby, it may be possible to irradiate and/or heat the recess intermittently, i.e., for several times, and to thereby repeatedly cause an attachment and detachment of the photosensitive compound to the copper surface, which may increase the anisotropy of the etching process. In addition, decomposition products may be avoided, which may improve the stability of the etching composition. In some embodiments, it may however also be sufficient if the photosensitive compound may not attach again to the copper surface if no longer irradiated and/or heated, i.e., if the photosensitive compound is configured for irreversibly detaching from a copper surface due to irradiation and/or heating, so as to obtain an appropriate anisotropy of the etching process.

In an embodiment, the photosensitive functional group may be selected from the group consisting of a nitrophenyl, a quinoline (in particular a hydroxyquinoline), a coumarin, a stilbene (in particular a cis-stilbene), a (di)azobenzene, a spiropyran, a triphenylmethane, an o-nitrobenzylester and a diazirine. These functional groups have proven particularly suitable for configuring the photosensitive compound to detach from (or alternatively attach to, for instance in case of a (di)azobenzene) a copper surface due to irradiation and/or heating. Among them, a (di)azobenzene, a spiropyran, a triphenylmethane and a coumarin may be in particular suitable for configuring the photosensitive compound to reversibly detach from a copper surface due to irradiation and/or heating, whereas an o-nitrobenzylester and a diazirine may be in particular suitable for configuring the photosensitive compound to irreversibly detach from a copper surface due to irradiation and/or heating. Possible reaction schemes of these photosensitive functional groups with electromagnetic radiation ("hv") and/or heat are shown in the following, which are however only for illustrative purposes and shall not be considered limiting the actual mechanism to those shown in the following:

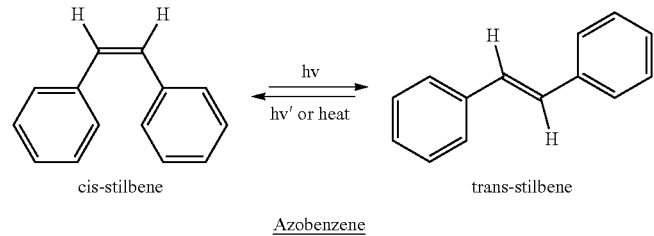

Azobenzene

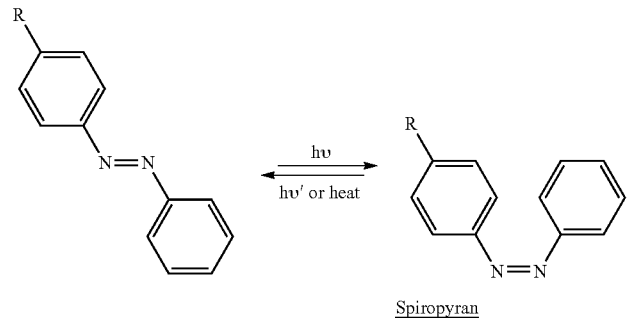

Spiropyran

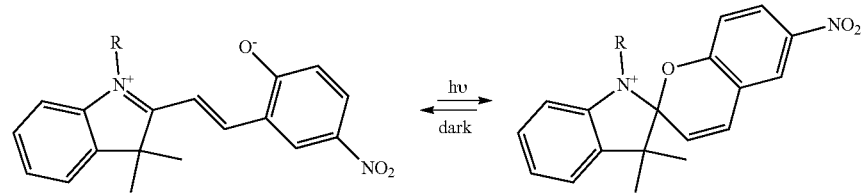

o-nitrobenzylester

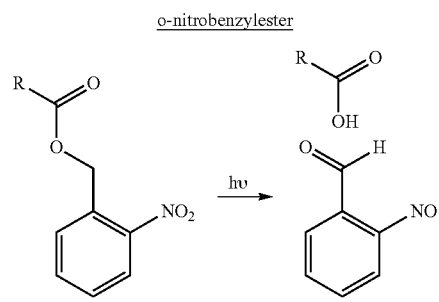

Triphenylmethane

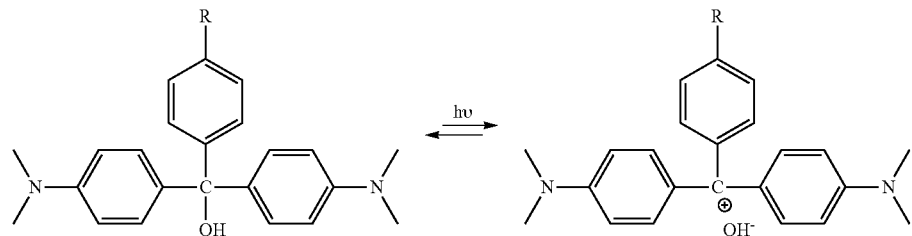

Coumarin

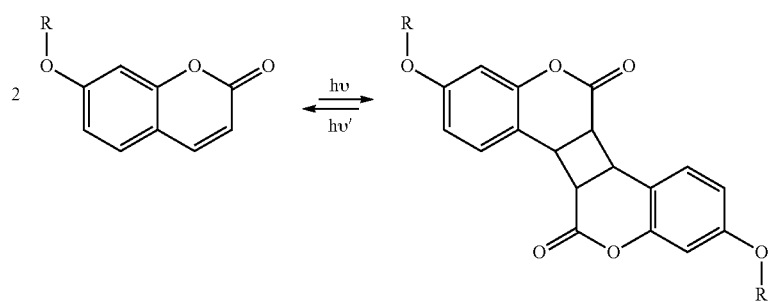

Diazirine

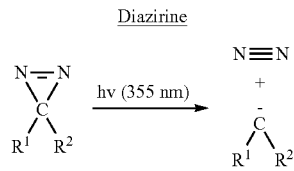

As an illustrative example, a diazirine functional group may form reactive carbene species upon irradiation with UV light, as illustrated above. The carbene may exist in a singlet form, wherein the two free electrons occupy the same orbital, or in a triplet form with two unpaired electrons in different orbitals. The substituents on the diazirine affect the type of carbene species generated upon irradiation and subsequent photolytic cleavage. Diazirine substituents that are electron donating in nature can donate electron density to the empty p-orbital of the carbene that will be formed, and hence can stabilize the singlet state. For example, phenyldiazirine produces phenylcarbene in the singlet carbene state whereas diazirine compounds having electron-withdrawing substituents, such as p-nitrophenylchlorodiazirine or trifluorophenyldiazirine, typically produce the respective triplet carbene products.

In an embodiment, the photosensitive functional group may also comprise a photolabile protecting group, such as at least one of the group selected from a nitrophenyl, a quinoline (in particular a hydroxyquinoline) and a coumarin. Suitable examples thereof are illustrated in the following:

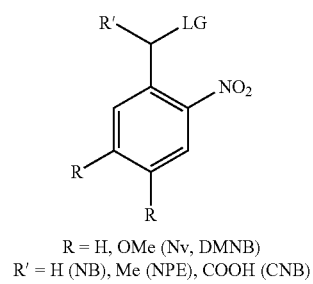

R = H, OMe (Nv, DMNB)
R' = H (NB), Me (NPE), COOH (CNB)

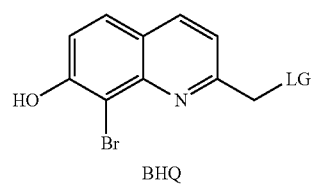

BHQ

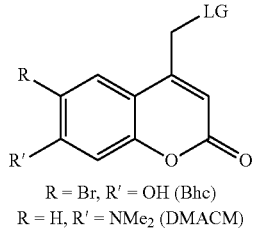

R = Br, R' = OH (Bhc)
R = H, R' = NMe$_2$ (DMACM)

In an embodiment, the photosensitive compound is configured for increasing the reactivity of the etching composition (such as by generating active ions or by increasing the electrical conductivity and/or the etching velocity) upon (due to, as a result of) to irradiation and/or heating. Without wishing to be bound to any theory, it is believed that an increased electrical conductivity and consequently an increase in etching velocity and/or reactivity may be due to a shift in electron density, which may for instance lead to an ionic character and/or an electron or proton transfer within a molecule (for instance a HOMO (Highest Occupied Molecular Orbital)-LUMO (Lowest Unoccupied Molecular Orbital) transition (according to the molecular orbital theory) of the molecule or between molecules induced by photoexcitation). Thus, the photosensitive compound may be responsive to irradiation and/or heating in a manner that ions may be generated and/or the electrical conductivity and/or the etching velocity may be increased by irradiating and/or heating the photosensitive compound. As a result, the reactivity of an etching composition containing the photosensitive compound may be increased due to irradiation and/or heating. By directing the irradiation and/or heating specifically or preferentially at a bottom part of the recess rather than at a side-wall part of the recess, the etching may preferentially proceed in the vertical direction rather than in the lateral direction of the recess and, as a result, an etched electrically conductive layer structure having a recess with substantially vertical side walls may be obtained. Without wishing to be bound to any theory, it is further believed that an increased electrical conductivity may be responsible for an increased redox potential of the whole etching formulation. In order to be able to efficiently oxidize the metal to be etched, a high redox potential is generally favored. During etching, the metal to be etched is oxidized, while the active etching component is reduced. Thus, it is advantageous to continuously regenerate the active etching component with an oxidizing medium. By increasing the electrical conductivity, it is believed that the metal to be etched could be more easily oxidized, as well as the active etching component during regeneration. Consequently, by increasing the redox potential, facilitated oxidation occurs and an increased etching rate can be achieved.

In an embodiment, the photosensitive compound may be comprised in the etching composition in a concentration of 250 mM (millimole) or more, such as 500 mM or more, such as 1 M (mole) or more, for instance up to 10 M, such as up to 5 M.

In an embodiment, the etching composition further comprises a wetting additive. Hereby, an exchange of components on surfaces may be improved.

In an embodiment, the wetting agent is a surface-active agent, such as a surfactant. The surfactant may be at least one selected from the group consisting of an anionic surfactant, a cationic surfactant, a nonionic surfactant and a zwitterionic surfactant. In particular, the surfactant may be at least one selected from the group consisting of an anionic surfactant, a cationic surfactant and a nonionic surfactant. More specifically, the surfactant may be at least one of an anionic surfactant and a cationic surfactant and even more specifically the surfactant may comprise an anionic surfactant. Without wishing to be bound to any theory, it is believed that the affinity (or adsorption onto a copper surface) may be strongly influenced by the surface energy of copper, and more particular, by the surface tension. By decreasing the surface tension, such as by means of a surfactant (or by increasing the ionic concentration), the wettability increases. With that, more molecules may reach the surface in order to either remove or protect the copper.

In an embodiment, the surfactant comprises at least one of a phosphor atom, a nitrogen atom and a sulphur atom. In particular, the surfactant may comprise one or more functional groups containing a phosphor atom, a nitrogen atom and/or a sulphur atom. A surfactant comprising such functional group may additionally protect or shield the side walls (of a recess formed in the electrically conductive layer structure during etching) from the etchant and may further suppress that the etching proceeds in a lateral direction.

In an embodiment, the etching composition further comprises a rheological additive. In the context of the present application, the term "rheological additive" may particularly denote a compound capable of modifying the rheological behavior of the etching composition. The rheological additive may comprise an organic compound and/or an inorganic compound.

In an embodiment, the rheological additive is selected from the group consisting of silica, hydroxyethyl cellulose, phyllosilicates and urea. The silica may in particular be a hydrophilic and/or pyrogenic and/or amorphous silica, such as HDK N20 (commercially available from Wacker Chemie AG, Munchen, Germany). The hydroxyethyl cellulose may in particular be a water-soluble hydroxyethyl cellulose, such as Natrosol 250 HHBR or Natrosol 250 HHX (commercially available from Ashland Inc., Covington, USA). The phyllosilicate may in particular be a hydrated phyllosilicate, such as Optigel WX (commercially available from Byk-Chemie GmbH, Wesel, Germany). The urea may in particular be a modified urea, such as Byk-7420 ES (commercially available from Byk-Chemie GmbH, Wesel, Germany).

Without wishing to be bound to any theory, the following is assumed: Based on the theory of spray-etching, the flow of an etching composition is more turbulent in the middle or center of an etched structure (such as a recess) so that the liquid is more agitated there than at the side walls of the structure to be etched. In this situation, the addition of a rheological additive to the etching composition may cause an increase in density and/or in viscosity of the etching composition near to the side walls in comparison to the middle of the structure. As a general rule, the lower the density and/or the viscosity of the etching composition, the easier a component exchange between the etching liquid and the etched surface (for instance made of copper). As a consequence, the addition of a rheological additive may result in a higher etching speed in a vertical direction and a lower etching speed in a horizontal (lateral) direction, thereby further increasing the anisotropy of the etching process and the resulting etched structures.

In an embodiment, the etching composition comprises an ionic liquid, in particular one or more (such as at least two or at least three) ionic liquids.

In the context of the present application, the term "ionic liquid" may particularly denote a liquid organic salt or a mixture of salts comprising or consisting of ions, in particular of organic cations and organic and/or inorganic anions, and having a melting point of less than 100° C., in particular a melting point within a temperature range of from −100° C. to 100° C. Thus, an ionic liquid within the meaning of the present specification may be in a liquid state at a temperature of less than 100° C., in particular at room temperature (20° C.), even though the salt or mixture of salts may not be dissolved in a solvent, such as water, i.e., it may be in a liquid state without the necessity of being dissolved in a solvent. Ionic liquids exhibit some very interesting characteristics, such as a very low, virtually non-measurable, vapor pressure, a high liquidus range, good electrical conductivity, and interesting solvation characteristics. In addition, ionic liquids may be designed or tailored (for instance by combination of various chemical structures of the ions, substituents and functional groups of the ionic liquids) in terms of their properties, such as melting point, viscosity, density, polarity, solubility, hydrophobicity/hydrophilicity and conductivity, so that ionic liquids may be very suitable for use in an etching composition according to an exemplary embodiment of the invention. In particular, the use of ionic liquids in the etching composition may allow to combine or compose plural specific functional groups having desired properties with one compound or mixture of compounds without introducing undesired entities into the etching composition. Thus, ionic liquids may contain functional groups having various different properties, such as copper etching inhibiting properties, photosensitive properties, wetting or surface-active properties, rheological properties and the like, which can be introduced to an etching composition at once by ionic liquids, thereby improving the etching performance (and in particular its anisotropy) based on different mechanisms without introducing undesired residues, as it could take place with conventional etching additives.

In an embodiment, the ionic liquid, in particular an organic cation thereof, comprises at least one functional group selected from the group consisting of a phosphor atom containing group, a nitrogen atom containing group, a sulphur atom containing group and a conjugated n-system. A phosphor atom containing group, a nitrogen atom containing group, a sulphur atom containing group have shown to preferably adsorb onto metallic surfaces. Moreover, compounds showing a conjugated n-system, such as phenolic compounds, have shown good adhesion properties.

Suitable organic cations of the ionic liquid include imidazolium (such as 1-alkyl-3-methyl imidazolium and 1-alkyl-2,3-dimethyl imidazolium), pyridinium (such as N-alkyl pyridinium), piperidinium (such as N-alkyl-N-methyl piperidinium), ammonium (such as tetraalkyl ammonium), phosphonium (such as tetraalkyl phosphonium), pyrrolidinium (such as N-alkyl-N-methyl pyrrolidinium), pyrazolium (such as 1,2-dialkyl pyrazolium), thiazolium (such as N-alkyl thiazolium) and sulfonium (such as trialkyl sulfonium) cations. The organic cations may further have one or more functional groups, for instance a copper etching inhibiting functional group and/or a photosensitive functional group, as exemplified in further detail above, or at least one surface-active functional group and/or rheology-modifying functional group, as exemplified in further detail above for the surfactant and the rheological additive, respectively.

Suitable anions of the ionic liquid include inorganic anions and organic anions. Suitable inorganic anions include chloride ($Cl^-$), bromide ($Br^-$), iodide ($I^-$), nitrate ($NO_3^-$), hexafluorophosphate ($PF_6^-$), tetrafluoroborate ($BF_4^-$) and dicyanamide ($[N(CN)_2]^-$). Suitable organic anions include tosylate, carboxylate (such as acetate or trifluoroacetate), alkyl phosphinate, alkyl phosphate, alkyl sulfate and bis(trifluoromethanesulfonyl)amide ($[(CF_3SO_2)_2N]^-$). The organic anions may further have one or more functional groups, for instance a copper etching inhibiting functional group and/or a photosensitive functional group as exemplified in further detail above, or at least one surface-active functional group and/or rheology-modifying functional group, as exemplified in further detail above for the surfactant and the rheological additive, respectively.

In an embodiment, the photosensitive compound comprises or consists of an ionic liquid, in particular one or more (such as at least two or at least three) ionic liquids, which may hereinafter also simply referred to as a "photosensitive ionic liquid".

In an embodiment, the photosensitive ionic liquid has at least one functional group configured for inhibiting copper etching, in particular a copper etching inhibiting functional group as exemplified in further detail above.

In an embodiment, the photosensitive ionic liquid is configured for detaching from (or alternatively attaching to) a copper surface upon (due to, as a result of) the irradiation and/or heating. To this end, the photosensitive ionic liquid may have at least one photosensitive functional group as exemplified in further detail above.

In an embodiment, the photosensitive ionic liquid is configured for increasing the reactivity of the etching composition (such as by generating active ions or by increasing the electrical conductivity and/or the etching velocity) upon (due to, as a result of) to irradiation and/or heating, as exemplified in further detail above.

In an embodiment, the etching composition comprises an ionic liquid having surface-active properties and/or rheological (rheology-modifying) properties, in particular an ionic liquid having a functional group with surface-active properties and/or a functional group with rheological properties. Such ionic liquid having surface-active properties and/or rheological properties may advantageously be used in combination with a photosensitive ionic liquid. The ionic liquid having surface-active properties and/or rheological properties may in particular comprise an ionic liquid having at least one surface-active functional group and/or rheology-modifying functional group, as exemplified in further detail above for the surfactant and the rheological additive, respectively.

In an embodiment, the etching composition may further comprise a solvent, in particular water and/or an organic solvent (such as a polar organic solvent). If the etching composition comprises one or more ionic liquids, as exemplified above, the etching composition may still further comprise a solvent, for instance water. Alternatively, the etching composition may (substantially) consist of the etchant and one or more ionic liquids, i.e., the one or more ionic liquids may not only represent an additive used for providing selected desired functional groups or properties to the etching composition, but they may maintain their properties as ionic liquid (e.g., as a solvent) and at the same time may provide functionalities, such as of a photosensitive compound, etc., as described in further detail above.

In an embodiment, the step of subjecting the electrically conductive layer structure to an etching composition comprises a spraying of the etching composition on the electrically conductive layer structure, such as on an exposed region of the electrically conductive layer structure.

In an embodiment, the method of etching an electrically conductive layer structure during manufacturing a component carrier comprises for at least for a part of time in the course of the step of subjecting the electrically conductive layer structure to an etching composition, an irradiation of and/or heating (the electrically conductive layer structure and/or) the recess formed in the step of subjecting the electrically conductive layer structure to an etching composition, in particular an irradiation and/or heating of a bottom portion or the bottom of the recess. It may be advantageous to perform the irradiation and/or heating in a substantially vertical manner (i.e., substantially vertically from above; having an incidence angle of about 90°, such as from 80° to 100°, in particular from 85° to 95°) which may allow a specific or preferential irradiation and/or heating of the bottom portion or the bottom of the recess, but substantially no irradiation and/or heating of side walls of the recess.

In an embodiment, the irradiating involves irradiating with electromagnetic radiation selected from the group consisting of ultraviolet radiation (such as having a wavelength of from 10 to 380 nm, in particular from 200 to 380 nm, in particular from 250 to 380 nm), visible light radiation (such as having a wavelength of from 380 to 780 nm) and infrared radiation (such as having a wavelength of from 780 nm to 1 mm, in particular near-infrared radiation having a wavelength of from 780 nm to 1.4 µm). In particular, ultraviolet radiation and/or visible light radiation may be used. In particular, ultraviolet radiation has proven particularly suitable for the etching process of the invention. As will be apparent to a person skilled in the art, the electromagnetic radiation may be appropriately selected depending on the kind of photosensitive compound used, which is typically responsive to electromagnetic radiation of some specific wavelength.

In an embodiment, the irradiating and/or heating is performed intermittently. In other words, the irradiating and/or heating may only be performed during a part of the period of carrying out the step of subjecting the electrically conductive layer structure to an etching composition, and there may in particular one or more periods of time while the step of subjecting the electrically conductive layer structure to an etching composition is performed, where no (active) irradiation and/or heating of the recess takes place. By taking this measure, it may for instance be possible to repeatedly cause an attachment and detachment of the photosensitive compound to the copper surface, in particular if the photosensitive compound is configured for reversibly detaching from a copper surface due to irradiation and/or heating or vice versa. As a result, the anisotropy of the etching process may be increased. Alternatively, the irradiating and/or heating may also be performed continuously during substantially the entire period of carrying out the step of subjecting the electrically conductive layer structure to an etching composition. In an embodiment, at least in the beginning of the step of subjecting the electrically conductive layer structure to an etching composition or until a recess is formed in the electrically conductive layer structure, no irradiation and/or heating is performed.

In an embodiment, the method of etching an electrically conductive layer structure during manufacturing a component carrier may further comprise (in particular after the etching and irradiation and/or heating) a step of rinsing the etching composition out of the recess. For instance, the step of rinsing may be carried out by applying (for instance spraying or dipping) a rinsing liquid. The rinsing step may be configured to substantially completely remove the etching composition from the recess.

In an embodiment, the method of etching an electrically conductive layer structure during manufacturing a component carrier may further comprise (in particular after the etching and irradiation and/or heating) a step of removing the mask layer, if applied, for instance by means of stripping.

In an embodiment, the etching process may be repeated several times, for instance at least once, such as at least twice, in particular at least three times. Hereby, still deeper etching structures or recesses may be formed.

In an embodiment, the electrically conductive layer structure is subjected to a subtractive etching procedure. Thus, the etching process may be a subtractive etching process.

In an embodiment, the etching process may be carried out by means of an etching apparatus as described herein.

In an embodiment, the etching apparatus comprises an etching unit configured for subjecting the electrically conductive layer structure to an etching composition comprising an etchant and a photosensitive compound to thereby form a recess in the electrically conductive layer structure, and an irradiation unit configured for (substantially vertically) irradiating the recess and/or a heating unit configured for (substantially vertically) heating the recess.

In an embodiment, the etching unit comprises spraying nozzles by means of which the respective etching compositions may be applied, in particular sprayed, (on)to the electrically conductive layer structure of the component carrier.

In an embodiment, the etching unit and the irradiation unit and/or the heating unit are arranged with regard to each other in a manner allowing a substantially vertical irradiation and/or heating of the recess (i.e., substantially vertically from above, for instance with an incidence angle of about 90°, such as from 80° to 100°, in particular from 85° to 95°). To this end, the etching unit and the irradiation unit and/or the heating unit may be arranged side by side and the etching apparatus further comprises a conveyor by means of which the component carrier may be transported from the etching unit to the irradiation unit and/or the heating unit, and vice versa. Alternatively, the irradiation unit and/or the heating unit may be integrated within the etching unit in a manner allowing a substantially vertical irradiation and/or heating of the recess.

In an embodiment, the irradiation unit comprises a radiation source, for instance an ultraviolet radiation source, a visible light radiation source and/or an infrared radiation source, in particular an ultraviolet radiation source and/or a visible light radiation source, in particular an ultraviolet radiation source.

In an embodiment, the irradiation unit is adapted to irradiate with electromagnetic radiation selected from the group consisting of ultraviolet radiation, visible light radiation and infrared radiation.

In an embodiment, the heating unit comprises a source for thermal energy.

In an embodiment, the irradiation unit and/or the heating unit is adapted to irradiate and/or heat intermittently. In particular, the irradiation unit and/or the heating unit may be configured such that the irradiation (or a respective radiation source) and/or the heating unit (or a respective source for thermal energy) may be repeatedly switched on and off, such as for several times per minute.

In an embodiment, the etching apparatus may be configured (or may be suitable) for carrying out the etching process as described herein.

In an embodiment, the etched electrically conductive layer structure is obtainable by an etching method as described herein and/or by means of an etching apparatus as described herein.

In an embodiment, the component carrier comprises a stack of at least one electrically insulating layer structure and at least one electrically conductive layer structure, wherein at least a part of at least one electrically conductive layer structure comprises an etched electrically conductive layer structure as described herein.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming throughholes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold), etc.

The aspects defined above and further aspects of the invention are apparent from the exemplary embodiments to be described hereinafter and are explained with reference to these exemplary embodiments.

DETAILED DESCRIPTION OF ILLUSTRATED EMBODIMENTS

Figure 1:
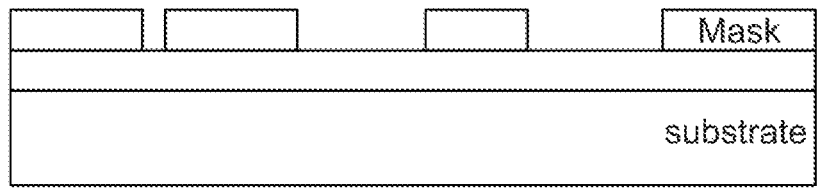
FIG. 1 illustrates a conventional isotropic copper etching process according to the prior art.
Figure 1:
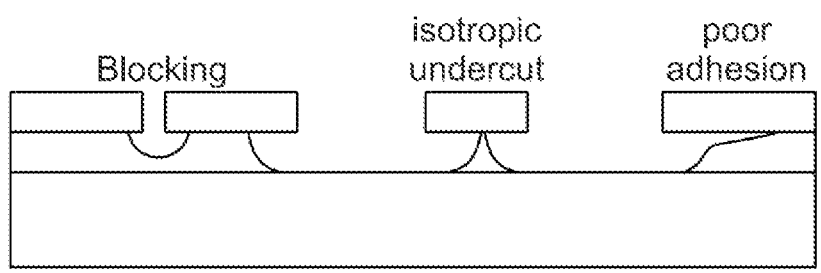
Figure 2:
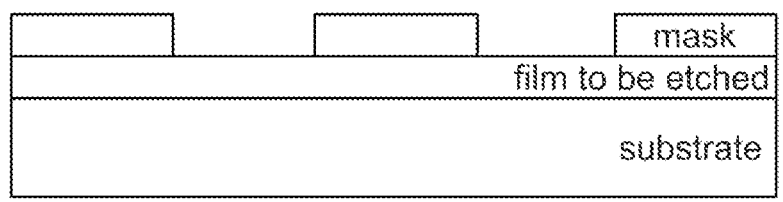
FIG. 2 illustrates an ideal anisotropic copper etching process.
Figure 2:
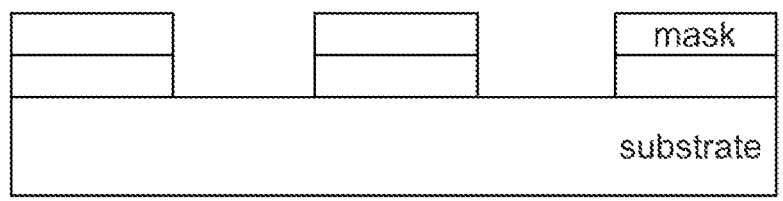

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a method of etching an electrically conductive layer structure during manufacturing a component carrier is provided wherein the electrically conductive layer structure is subjected to an etching step in the presence of a photosensitive compound, while a hereby formed recess is irradiated and/or heated for at least a part of time of the etching step. The photosensitive compound may be responsive to irradiation and/or heating in a manner such that the etching proceeds more in a vertical direction than in a lateral direction of the recess, thereby increasing an anisotropy of the etching process. For instance, the photosensitive compound may have a high affinity to copper (such as due to respective functional groups of the photosensitive compound) and may consequently tend to adhere to a copper surface, thereby impeding a contact of an etchant with the copper surface and consequently inhibiting an etching of the copper surface by the etchant. Furthermore, the photosensitive compound may be responsive to irradiation and/or heating in a manner that the affinity to copper of the photosensitive compound may be reduced due to the irradiation and/or heating or vice versa. Descriptively spoken, the photosensitive compound when not illuminated and/or not heated may have active centers that adhere to a copper surface and protect it from etching or vice versa. When illuminated and/or heated, these centers are deactivated and detach from the surface or vice versa. As a consequence, such irradiated and/or heated photosensitive compound may no longer protect or shield the copper surface from the etchant. By directing the irradiation and/or heating specifically or preferentially at a bottom part of the recess rather than at a side-wall part of the recess (for instance by irradiating and/or heating the recess substantially vertically), the detachment or deprotection may specifically occur at the bottom part and consequently the etching may preferentially proceed in the vertical direction rather than in the lateral direction of the recess. As a result, an etched electrically conductive layer structure having a recess with substantially vertical side walls may be obtained. As another example, the photosensitive compound may be responsive to irradiation and/or heating in a manner that ions may be generated and/or the electrical conductivity and/or the etching velocity may be increased by irradiating and/or heating the photosensitive compound. As a result, the reactivity of an etching composition containing the photosensitive compound may be increased due to irradiation and/or heating. Also in this case, by directing the irradiation and/or heating specifically or preferentially at a bottom part of the recess rather than at a side-wall part of the recess, the etching may preferentially proceed in the vertical direction rather than in the lateral direction of the recess and an etched electrically conductive layer structure having a recess with substantially vertical side walls may be obtained. As a result, the overall quality of a component carrier, such as a printed circuit board, may be increased, in particular in terms of a decreased defect rate as well as an improved etching distribution (increased homogeneity) within the produced boards and a higher etching factor of etched structures. In addition, a line width lower than 50 μm, such as 30 μm or less, or even less than 20 μm may be achieved.

The photosensitive compound suitable for use in the present invention may include the following groups and involve the following mechanisms, which are however only for illustrative purposes and shall not be considered limiting the actual mechanism to those shown in the following:

Group 1 (Photo-Isomerization):

Azobenzene, spiropyrans and stilbene show following mechanism upon irradiation (These reactions could also be induced by heat!):

Upon irradiation, typically in the ultraviolet range, a conformational rearrangement of the molecules is induced. For azobenzene and stilbene, the rearrangement is described by variations in the molecular symmetry, which changes from a thermally stable trans (E) orientation to a less favorable cis (Z) orientation. In spiropyrans, the irradiation induces a ring-opening reaction which leads to the formation of the isomeric merocyanine form.

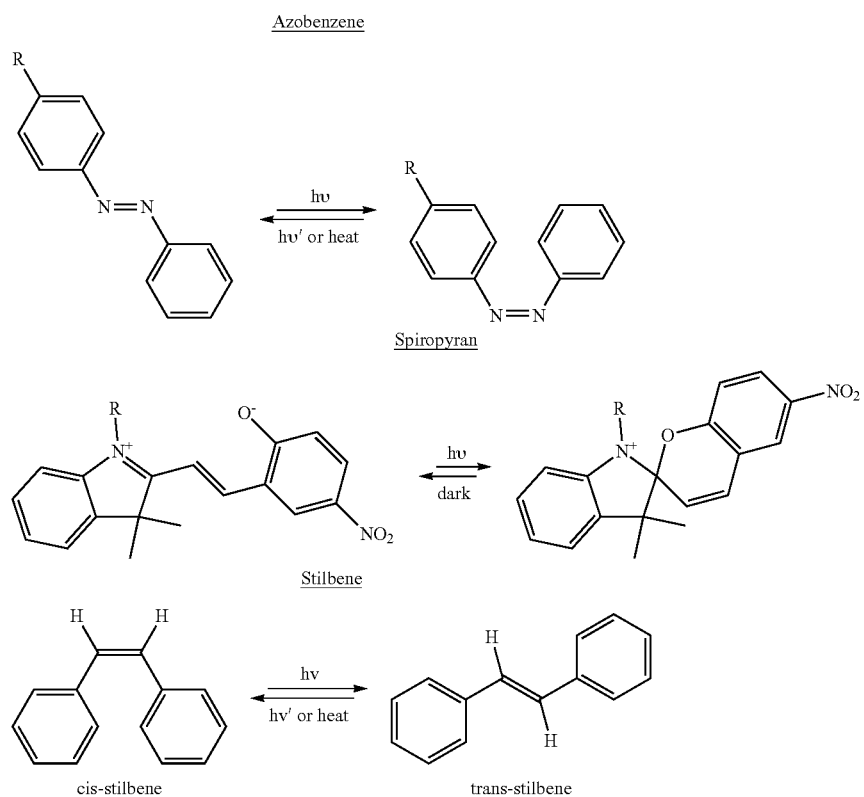

One of the most desired features of such photosensitive molecules is that the isomerization is usually accompanied by a change in physical properties such as polarity, viscosity and absorbance. In addition to this, macroscopic changes in material properties such as thickness, wettability and stability occur. In the case of azo compounds, the excited cis-form shows increased polarity compared to the trans-form. Thus, when the azo compound is in cis configuration, it shows higher polarity than in trans (the higher polarity could increase the adhesion to copper), which can be used to control the interaction between copper and the protecting additive of the etching liquid.

Besides a change in the polarity, a change in conformation (of the azobenzene) can provide a steric hindrance for the active etching component.

Group 2 (Photo-Cleavage):

Nitrobenzyl-based compounds (these compounds belong to the well-known photolabile protecting group PPG) show following mechanism upon irradiation:

Nitrobenzyl-ester usually undergo a Norrish type II reaction, whereby $CO_2$ is cleaved off after several rearrangements of the molecule (not reversible, as indicated by the arrow, which is directed towards the product):

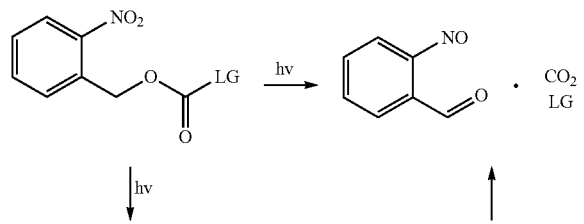

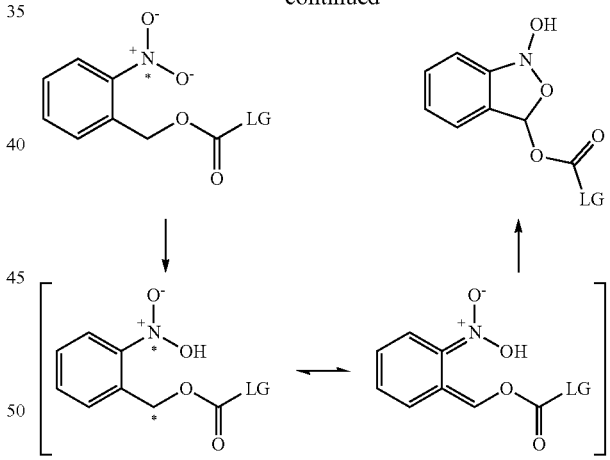

According to this reaction scheme, photons induce a diradical excited state by a bond cleavage of the N=O π-bond in the nitro-group. Subsequently, the nitrogen radical abstracts a proton from the benzylic carbon, which leads to an aci-nitro compound. This is followed by a rearrangement inducing the formation of a five-membered ring, before the PPG is cleaved off in order to yield a 2-nitrosobenzaldehyde and a carboxylic acid. Nitrosobenzaldehyde may further adsorb onto the copper surface, in order to protect it.

Whereas nitrobenzyl-ester usually non-reversible respond to UV light, triphenylmethane reversibly produce ions, and could be thermally recombined with the counter ion:

Triphenylmethane

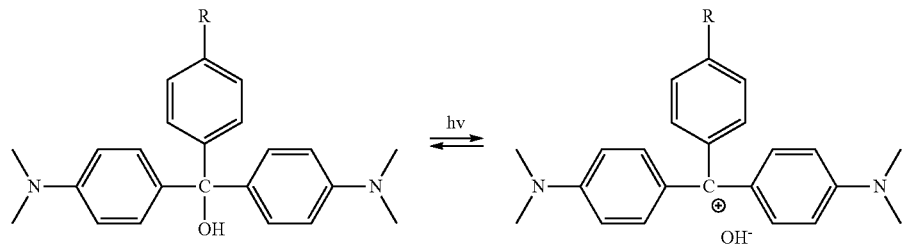

Diazirine non-reversible decomposes upon radiation to reactive carbenes. These highly reactive compounds are quickly quenched by the reaction with water molecules. So, they would temporarily increase the ionic concentration, but will quickly react with the water present in the etching liquid:

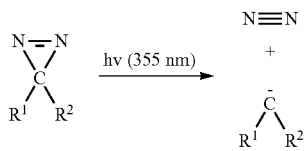

Group 3 (Photo-Dimerization):

Coumarins are frequently used as reversible crosslinking point. E.g., upon irradiation dimerization of two coumarin molecules occur. If adsorbed on the copper surface, upon irradiation, the active etching compound is even more sterically hindered to attack the copper surface:

Coumarin

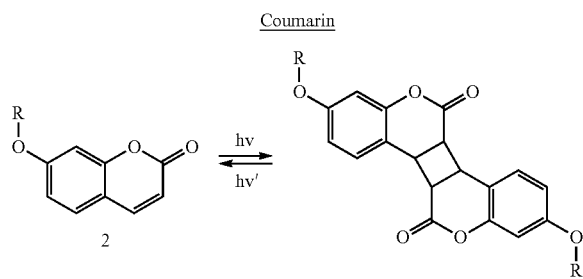

Figure 3:
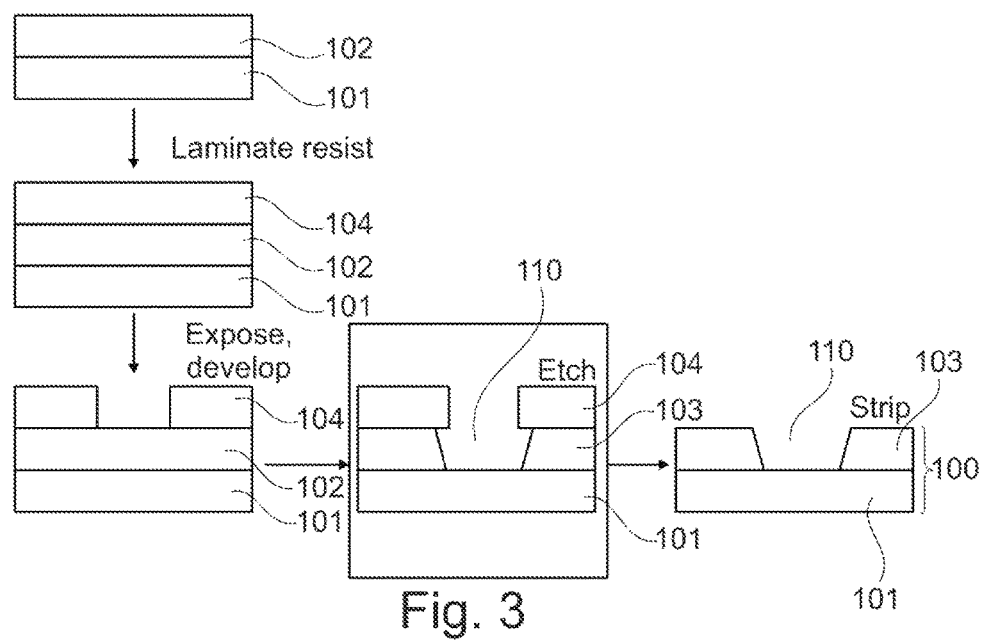
FIG. 3 illustrates a photolithographic structuring of an electrically conductive layer structure of a component carrier by means of a photoresist involving a subtractive etching process according to an exemplary embodiment of the invention.

FIG. 3 illustrates a photolithographic structuring of an electrically conductive layer structure 102 of a component carrier 100 by means of a photoresist 104 involving a subtractive etching process according to an exemplary embodiment of the invention. In a first step, a laminate or stack of an electrically insulating layer structure 101 (such as made of a dielectric) and an electrically conductive layer structure 102 (such as made of copper) to be etched is provided. Next, a photoresist layer 104 is applied on the electrically conductive layer structure 102. Then, the photoresist 104 is partly exposed (through a mask, not shown) to electromagnetic radiation (such as UV light) and developed, thereby removing that part of the photoresist 104 that has been exposed to the electromagnetic radiation. In the next step, a subtractive etching step according to an exemplary embodiment of the invention is performed (highlighted by a frame). Hereby, the electrically conductive layer structure 102 is anisotropically etched so that the side walls of a recess 110 formed in the electrically conductive layer structure 102 are substantially vertical, even though a slight undercut beneath the photoresist 104 is shown in FIG. 3. Thus, the electrically conductive layer structure 102 becomes an etched electrically conductive layer structure 103 in this step. Finally, the remaining photoresist 104 (such as that part of the photoresist that has not been exposed to the electromagnetic radiation before) is removed, for instance stripped off, and a component carrier 100 according to an exemplary embodiment of the invention comprising the etched electrically conductive layer structure 103 on the electrically insulating layer structure 101 is obtained.

FIGS. 4A to 4D illustrate the etching step highlighted by the frame in FIG. 3 according to an exemplary embodiment of the invention. FIGS. 4A to 4D in particular illustrate intermediate stages of the etching process according to an exemplary embodiment of the invention.

Figures 4A, 4B, 4C, 4D:
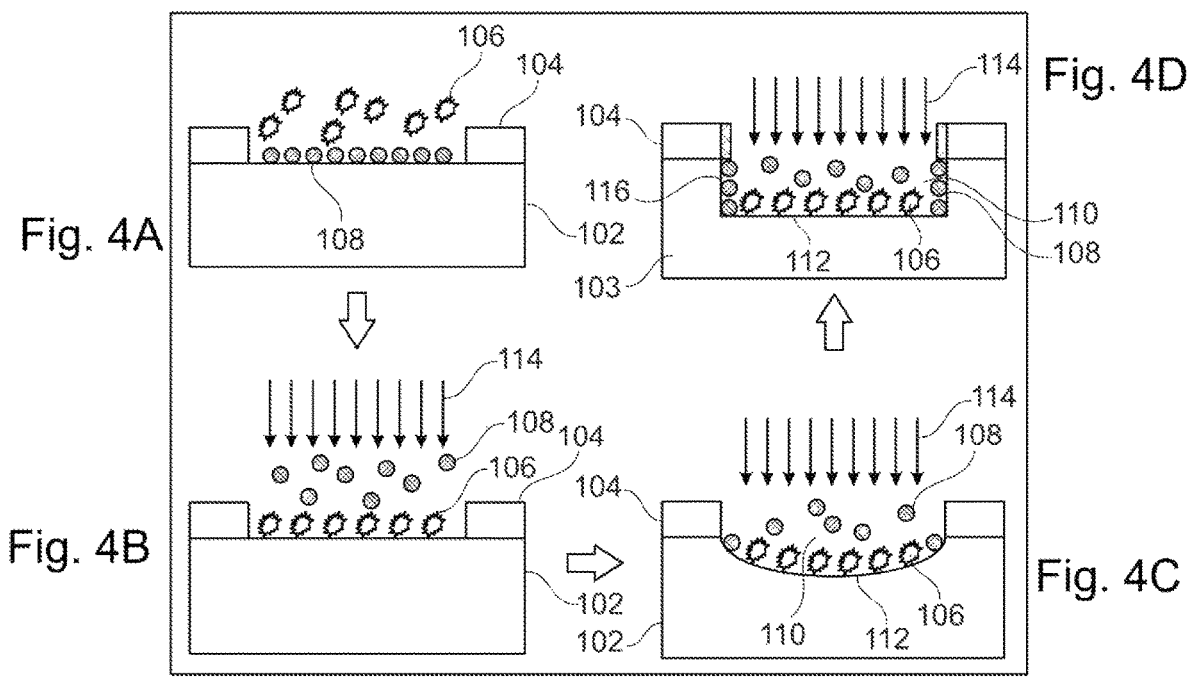
FIG. 4A, FIG. 4B, FIG. 4C and FIG. 4D illustrate the etching step shown in FIG. 3 according to an exemplary embodiment of the invention.

Referring to FIG. 4A, an electrically conductive layer structure 102 that is partly exposed from a photoresist 104 is subjected to an etching composition comprising an etchant 106 and a photosensitive compound 108. The electrically conductive layer structure 102 that is made for instance of copper is not irradiated and/or heated at that time so that the photosensitive compound 108 which has a high affinity to copper occupies the exposed copper surface of the electrically conductive layer structure 102, thereby impeding a contact of the etchant 106 with the copper surface and consequently substantially inhibiting an etching of the copper surface by the etchant 106.

Referring to FIG. 4B, the exposed copper surface of the electrically conductive layer structure 102 is irradiated and/or heating with irradiation and/or heating 114, such as electromagnetic radiation, substantially vertically from above, i.e., with an incidence angle of about 90°. The irradiation and/or heating 114 triggers a detachment of the photosensitive compound 108 from the exposed copper surface so that the etchant 106 may reach the copper surface and exhibits its etching activity. As a result, a recess 110 within the electrically conductive layer structure 102 develops, as shown in FIG. 4C. With continuing irradiation and/or heating 114 in particular of the bottom portion 112 of the recess 110, the etchant 106 etches deeper and deeper within the electrically conductive layer structure 102 and the recess 110 grows in a vertical direction. Where irradiated and/or heated, the photosensitive compound 108 has a low affinity to copper and can therefore not protect the irradiated and/or heated bottom portion 112 of the recess 110. However, as illustrated in FIG. 4D, with further continuing vertical irradiation and/or heating 114, the side walls 116 of the recess are substantially not irradiated and/or heated. Moreover, after some little etching in a lateral direction, the photoresist 104 may cast a shadow so that the non-irradiation and/or non-heating of the side walls 116 may be further pronounced. If not irradiated and/or heated, the photosensitive compound 108 has (again) a high affinity to copper and may therefore adhere to the side walls 116 and protect them from further etching in a lateral direction. In contrast, the bottom portion 112 of the recess 110 is still irradiated and/or heated so that the etching may proceed in a vertical direction. As a result, an anisotropic etching may be achieved and an etched electrically conductive layer structure 103 having a recess 110 with substantially vertical side walls 116 may be obtained.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE SIGNS

- 100 Component carrier
- 101 Electrically insulating layer structure
- 102 Electrically conductive layer structure
- 103 Etched electrically conductive layer structure
- 104 Photoresist
- 106 Etchant
- 108 Photosensitive compound
- 110 Recess
- 112 Bottom portion
- 114 Irradiation and/or heating
- 116 Side wall

The invention claimed is:

1. A method of etching an electrically conductive layer structure during manufacturing a component carrier, the method comprising:
   subjecting the electrically conductive layer structure comprising a copper surface to an etching composition comprising an etchant and a photosensitive compound to thereby form a recess in the electrically conductive layer structure; and
   irradiating the recess at least for a part of time while the electrically conductive layer structure is subjected to the etching composition;
   wherein the photosensitive compound has at least one functional group configured for inhibiting copper etching,
   wherein the photosensitive compound has at least one functional group selected from the group consisting of a nitrophenyl, a stilbene, a diazobenzene, a spiropyran, a triphenylmethane, an o-nitrobenzylester and a diazirine,
   wherein the irradiating detaches the photosensitive compound from the copper surface.

2. The method according to claim 1, wherein the etchant comprises at least one of cupric chloride ($CuCl_2$) and ferric chloride ($FeCl_3$), and optionally at least one of hydrochloric acid (HCl) and hydrogen peroxide ($H_2O_2$).

3. The method according to claim 1, wherein the at least one functional group configured for inhibiting copper etching is selected from the group consisting of a phosphor atom containing group, a nitrogen atom containing group, a sulphur atom containing group and a conjugated $\pi$-system.

4. The method according to claim 1, wherein the irradiating increases the reactivity of the etching composition.

5. The method according to claim 1, wherein the etching composition comprises a rheological additive.

6. The method according to claim 1, wherein the photosensitive compound comprises an ionic liquid.

7. The method according to claim 1,
   wherein the etching composition further comprises a solvent; or
   wherein the etching composition comprises the etchant and one or more ionic liquids.

8. The method according to claim 1,
   wherein the irradiating involves irradiating with electromagnetic radiation selected from the group consisting of ultraviolet radiation, visible light radiation and infrared radiation; and/or
   wherein the irradiating is performed intermittently.

9. A method of etching an electrically conductive layer structure during manufacturing a component carrier, the method comprising:
   subjecting the electrically conductive layer structure to an etching composition comprising an etchant and a photosensitive compound to thereby form a recess in the electrically conductive layer structure; and
   irradiating the recess at least for a part of time while the electrically conductive layer structure is subjected to the etching composition;
   wherein the photosensitive compound has at least one functional group configured for inhibiting copper etching,
   wherein the photosensitive compound comprises an ionic liquid comprising organic cations and at least one of organic anions or inorganic anions and having a melting point of less than 100° C.

10. A method of etching an electrically conductive layer structure during manufacturing a component carrier, the method comprising:
    subjecting the electrically conductive layer structure to an etching composition comprising an etchant and a photosensitive compound to thereby form a recess in the electrically conductive layer structure; and
    irradiating the recess at least for a part of time while the electrically conductive layer structure is subjected to the etching composition;
    wherein the photosensitive compound has at least one functional group configured for inhibiting copper etching,
    wherein the irradiating increases an affinity of the photosensitive compound for attaching to a copper surface.

* * * * *